United States Patent
Mauer et al.

(10) Patent No.: US 10,446,387 B2
(45) Date of Patent: Oct. 15, 2019

(54) APPARATUS AND METHOD TO CONTROL ETCH RATE THROUGH ADAPTIVE SPIKING OF CHEMISTRY

(71) Applicant: VEECO PRECISION SURFACE PROCESSING LLC, Horsham, PA (US)

(72) Inventors: Laura Mauer, South Kent, CT (US); John Taddei, Jim Thorpe, PA (US); James Swallow, Horsham, PA (US); David Goldberg, Horsham, PA (US); Eric Kurt Zwirnmann, Horsham, PA (US)

(73) Assignee: VEECO PRECISION SURFACE PROCESSING LLC, Horsham, PA (US)

( * ) Notice: Subject to any disclaimer, the term of this patent is extended or adjusted under 35 U.S.C. 154(b) by 30 days.

(21) Appl. No.: 15/477,863

(22) Filed: Apr. 3, 2017

(65) Prior Publication Data
US 2017/0287793 A1    Oct. 5, 2017

Related U.S. Application Data

(60) Provisional application No. 62/318,574, filed on Apr. 5, 2016.

(51) Int. Cl.
| | |
|---|---|
| *H01L 21/302* | (2006.01) |
| *H01L 21/02* | (2006.01) |
| *H01L 21/67* | (2006.01) |
| *G06F 17/11* | (2006.01) |
| *H01L 21/306* | (2006.01) |
| *H01L 21/66* | (2006.01) |

(52) U.S. Cl.
CPC ........ *H01L 21/02019* (2013.01); *G06F 17/11* (2013.01); *H01L 21/30604* (2013.01); *H01L 21/67253* (2013.01); *H01L 22/20* (2013.01); *H01L 22/26* (2013.01); *H01L 22/12* (2013.01)

(58) Field of Classification Search
CPC ... H01L 22/26; H01L 22/20; H01L 21/30604; H01L 22/12; H01L 21/67253; H01L 21/02019
See application file for complete search history.

(56) References Cited

U.S. PATENT DOCUMENTS

| | | | |
|---|---|---|---|
| 6,123,865 A | 9/2000 | Lin et al. | |
| 6,539,952 B2 | 4/2003 | Itzkowitz | |
| 6,821,892 B1 | 11/2004 | Peng et al. | |

(Continued)

FOREIGN PATENT DOCUMENTS

WO    WO 2014/172835 A1    10/2014

OTHER PUBLICATIONS

Mauer et al., "Wet silicon etch process for TSV reveal", IEEE, Published in Electronic Components and Technology Conference (ECTC), 2014 IEEE 64th, May 27-30, 2014. pp. 1-5.

(Continued)

*Primary Examiner* — Shouxiang Hu
(74) *Attorney, Agent, or Firm* — Leason Ellis LLP

(57) ABSTRACT

An apparatus and method are provided to: determine a unique profile to etch each wafer, execute that etch, and determine and deliver the proper chemical addition in order to maintain etch rate within tight tolerances.

23 Claims, 8 Drawing Sheets

(56) References Cited

U.S. PATENT DOCUMENTS

| | | |
|---|---|---|
| 6,897,964 B2 | 5/2005 | Takahashi et al. |
| 7,175,505 B1 | 2/2007 | Ko et al. |
| 7,947,567 B2 | 5/2011 | Oh et al. |
| 8,617,348 B1 | 12/2013 | Liu et al. |
| 9,541,837 B2 | 1/2017 | Taddei et al. |
| 2003/0084918 A1 | 5/2003 | Kim |
| 2004/0139985 A1* | 7/2004 | Hegedus .............. B08B 3/02 134/1.3 |
| 2005/0048800 A1 | 3/2005 | Wagener |
| 2005/0245086 A1 | 11/2005 | Wang et al. |
| 2006/0003566 A1 | 1/2006 | Emesh |
| 2006/0097355 A1 | 5/2006 | Bauer et al. |
| 2006/0191637 A1 | 8/2006 | Zajac et al. |
| 2007/0169792 A1 | 7/2007 | Itzkowitz |
| 2008/0078427 A1 | 4/2008 | Matsunaga |
| 2008/0185103 A1 | 8/2008 | Bornstein et al. |
| 2008/0218983 A1 | 9/2008 | Nakamura |
| 2009/0278238 A1 | 11/2009 | Bonifield |
| 2010/0144118 A1 | 6/2010 | Yang |
| 2011/0222071 A1 | 9/2011 | Grotkopp |
| 2011/0261371 A1 | 10/2011 | Schoenleber |
| 2012/0053717 A1 | 3/2012 | Duboust |
| 2012/0119355 A1 | 5/2012 | Chung et al. |
| 2012/0182636 A1 | 7/2012 | Seibert et al. |
| 2012/0231562 A1 | 9/2012 | Takeya et al. |
| 2012/0285482 A1 | 11/2012 | Beck |
| 2012/0285483 A1 | 11/2012 | Liu et al. |
| 2013/0267099 A1 | 10/2013 | Yu |
| 2014/0038353 A1 | 2/2014 | Kim |
| 2014/0242731 A1 | 8/2014 | Mauer et al. |
| 2014/0327150 A1 | 11/2014 | Jung |
| 2015/0040952 A1 | 2/2015 | Regan et al. |
| 2015/0048496 A1 | 2/2015 | Chiu |
| 2015/0093906 A1* | 4/2015 | Kobayashi ........ H01L 21/31111 438/748 |
| 2016/0126148 A1 | 5/2016 | Mauer et al. |

OTHER PUBLICATIONS

Mauer et al., "Lowering cost of silicon etch for revealing TSVs", Chip Scale Review, Nov./Dec. 2013. pp. 1-4.

* cited by examiner

No spiking with spiking

APPARATUS AND METHOD TO CONTROL ETCH RATE THROUGH ADAPTIVE SPIKING OF CHEMISTRY

CROSS-REFERENCE TO RELATED PATENT APPLICATIONS

This application is based on and claims priority to U.S. Provisional Patent Application 62/318,574, filed Apr. 5, 2016, the entire contents of which is incorporated by reference herein as if expressly set forth in its respective entirety herein.

TECHNICAL FIELD

The present embodiment generally relates to an apparatus and method for etching semiconductor wafers and, more specifically, relates to an apparatus and method configured to: determine a unique profile to etch each wafer, execute that etch, and determine and deliver the proper chemical addition in order to maintain etch rate within tight tolerances.

BACKGROUND

Semiconductor wafer substrates have been thinned by wet etch for a number of reasons for many years. Post grind stress relief (to remove grind marks and surface damage) is an example. The wet process is a chemical reaction. One chemistry commonly used for isotropic wet etching of silicon is a combination of nitric acid and hydrofluoric acid (HF), along with other diluting agents not involved in the stoichiometry of the reaction. The nitric acid acts as an oxidizer to convert the surface into silicon dioxide and then the HF etches (dissolves) the oxide. The reaction proceeds as shown below and has been well documented in the literature.

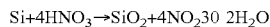

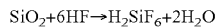

Semiconductor wafer manufacturing in the past simply charged the etch tool with a batch of chemistry and etched wafers for a set period of time. The etch process was not tailored to individual wafers as no wafer specific information was available to the etch tool. Accordingly, the goal was to have the same etch profile on each wafer. When the chemistry (etchant) was fresh, the etch rate was at its highest rate. Each wafer etched consumed a portion of the active ingredients and accordingly, the etch rate continually diminished with use as shown in FIG. 1. When the chemical bath etch rate declined to the minimum acceptable level, the batch of chemistry was drained and new chemistry filled the tool, thereby restoring the etch rate. Chemistry usage was high due to the continuous replacement of the chemistry and wafers were not etched to the same depth so improvements were sought.

FIGS. 3A-3C illustrate the deficiencies described above and in particular, depict an example in which the etch recipe is calculated to remove a selected amount of material, in this case 10 microns, from each processed wafer using the same etch process (e.g., the same batch of chemistry, the same etch time, etc.).

For example, FIG. 3A depicts a first wafer 10 (W10) both pre and post etching. As shown, the first wafer 10 initially has a thickness of 300 microns and it is desired to remove 10 microns, thereby producing a wafer having a thickness of 290 microns. The first wafer 10, as shown, has a uniform profile defined by a planar top surface. The first wafer 10 is the first wafer to be exposed to the etchant. Since the chemistry is fresh and the first wafer 10 has a uniform profile, the etching process results in the desired 10 microns being removed from the first wafer 10. The post etch wafer thus has a uniform profile defined by a planar top surface.

FIG. 3B depicts a second wafer 20 (W20) both pre and post etching. As shown, the second wafer 20 does not have a uniform profile due to a center to edge variation (i.e., the edge is thicker). When the etchant used in the etch process to etch the first wafer 10 is used again and the same etch rate is intended to be maintained (i.e., removal of 10 microns), the resulting (observed) etch rate slightly diminishes (as indicated by the change in the etch depth) due to the chemistry losing some of its effectiveness. For example, the second wafer 20 has a thickness at the edge of 305 microns and at the center of 300 microns. Etching the second wafer 20 results in only 9.9 microns of material being removed as opposed to the 10 microns removed for the first wafer 10 due to not only the non-uniformity of the second wafer's profile but also due to the loss in effectiveness of the chemistry. This results in the post etch wafer still suffering from a lack on uniformity in that the top surface still has center to edge variation (the edge is thicker).

FIG. 3C depicts a third wafer 30 (W30) both pre and post etching. As shown, the third wafer 30 does not have a uniform profile due to a center to edge variation (i.e., the center is thicker). When the etchant used in the etch process to etch the first and second wafers 10, 20 is used again and the etch rate is maintained (i.e., intended removal of 10 microns), the resulting (observed) etch rate further diminishes (as indicated by the change in the etch depth). For example, prior to etching the third wafer 30 has a center thickness of 300 microns and an edge thickness of 293 microns. Etching the third wafer 30 at the same etch rate (i.e., intended to remove 10 microns) results in less than 10 microns being removed and in particular, in this example, only 9.8 microns of material is removed. This results in the post etch wafer still suffering from a lack on uniformity in that the top surface still has center to edge variation (the center is etched to 293.2 microns and the edge is etched to 283.2 microns).

It will thus be appreciated that the etching process described in the above Examples does not correct for the non-uniformity of the wafer in the wafer examples of FIGS. 3B and 3C.

Subsequent attempts were made to maintain etch rate by adding chemistry and this technique is referred to as spiking. Since the processes for each wafer are identical and etch times constant, the same volume of chemistry can be added to maintain etch rate as shown in FIG. 2. This method worked fairly well when the wafer geometries were large and the same process could be used on each wafer.

FIGS. 4A-4C illustrate the deficiencies described above and in particular, depict examples in which the etch recipe is calculated to remove a selected amount of material (e.g., 10 microns) from each processed wafer using the same etch process and same etch time. However, in this comparative example, chemistry was added (spiking) for each etch process after the first one. In the illustrated exemplary embodiment, a constant amount (e.g., 2.0 ml) of chemistry is added after an etch process is performed on a given wafer. In other words, a program with a 2.0 ml spike is implemented. It will be appreciated that the amount of chemistry to be added to refresh the etchant chemistry will vary and can be selected in view of the specific application. Thus, a 2.0 ml spike dosage that is added after performing each etching process is only exemplary in nature and is not limiting. The amount (volume) of the spike dosage is preferably an amount that is intended to refresh the chemistry (etchant) to allow the selected etch rate to be maintained for each subsequent etch.

For example, FIG. 4A depicts the first wafer 10 both pre and post etching. As shown, the first wafer 10 has a uniform profile and has a thickness of 300 microns and it is desired to remove 10 microns, thereby producing an etched wafer having a thickness of 290 microns. The first wafer 10 is the first wafer to be exposed to the etchant. Since the chemistry is fresh and the first wafer has a uniform profile, the etching process results in the desired 10 microns being removed from the first wafer 10. The post etch wafer thus maintains its uniform profile due to the uniform etch.

FIG. 4B depicts the second wafer 20 both pre and post etching. As shown, the second wafer 20 does not have a uniform profile due to a center to edge variation (i.e., the edge is thicker (e.g., edge thickness is 305 microns). When chemistry (i.e., 2.0 ml) is added to the batch of chemistry to maintain the etch rate, immediately after wafer 10 is etched and before wafer 20 is etched, the resulting (observed) etch rate is maintained and results in 10 microns of material being removed. However, since the second wafer 20 has a non-uniform profile (edge is thicker), the resulting etched wafer suffers from the same deficiencies as the pre etched wafer in that the resulting wafer continues to have center to edge variation (the edge is thicker) even though the chemistry was spiked. Thus, the edge is etched to 295 microns and the center is etched to 290 microns. Spiking the chemistry thus does not correct the non-uniform nature of the wafer, but does ensure the etch rate is constant and same amount of material is removed.

FIG. 4C depicts the third wafer 30 both pre and post etching. As shown, the third wafer 30 does not have a uniform profile due to a center to edge variation (i.e., the center is thicker). When chemistry (i.e., 2.0 ml) is added to the batch of chemistry to maintain the etch rate, the resulting (observed) etch rate is maintained and results in 10 microns of material being removed. However, the third wafer 30 has a non-uniform profile (center is thicker) and therefore, the resulting etched wafer suffers from the same deficiencies as the pre etched wafer in that the resulting wafer continues to have center to edge variation (the center is thicker) even though the chemistry was spiked. Thus, the edge is etched to 283 microns and the center is etched to 293 microns. Spiking the chemistry thus does not correct the non-uniform nature of the wafer.

Over time, geometries diminished and the demand for tighter uniformity between post etch wafers became a requirement. Subsequent etch tool developments to meet these new needs included on board measurement capability. Now instead of etching all wafers with the same process, an etch process could be tailored to a specific wafer. In the tailoring process, the non-uniformities from wafer grind could be taken into consideration. These non-uniformities include center to edge variations and incoming thickness variations. With the on board measurement capability, computer based algorithms to determine a customized etch profile, and the ability to change process parameters to deliver a unique etch profile to every wafer, a new breed of etch tool was able to deliver a value added process. In the above example, the wafers would not only be stress relieved but would now have TTV (total thickness variation) reduced and can be brought to a specific thickness post etch. These factors added value to the process; however, since each wafer received a unique process (different profile and different etch depth), the single value for chemistry spiking was no longer sufficiently accurate. In other words, uniform spiking of the chemistry does not optimize the wafer etching and can lead to both under-etching and over-etching.

SUMMARY

In one exemplary embodiment, the present embodiment is comprised of a single wafer wet process etching tool. The tool is equipped with standard features, including but not limited to: a means to get the wafers through the tool, a processing chamber to handle the etch process, a means to rinse and dry the wafers, a chemical path to load, dispense, mix chemistry, control temperature and control flow of the chemistry. The new features to carry the adaptive spiking technology include: wafer thickness measurement tool, computer algorithm to calculate the etch profile, Profile Match Technology to be able to control the tool to deliver the required etch profile on the wafer at the proper depth, the algorithm to calculate the material removed and derive the proper spiking volume based on material removed, a metering pump or other high accuracy method to deliver the calculated spiking volume (spike dosage) (typically spiking volume of HF is 2.00 ml+\-0.5%).

These and other aspects, features, and advantages can be appreciated from the accompanying description of certain embodiments of the embodiment and the accompanying drawing figures and claims.

DETAILED DESCRIPTION OF THE EMBODIMENT

Figure 1:
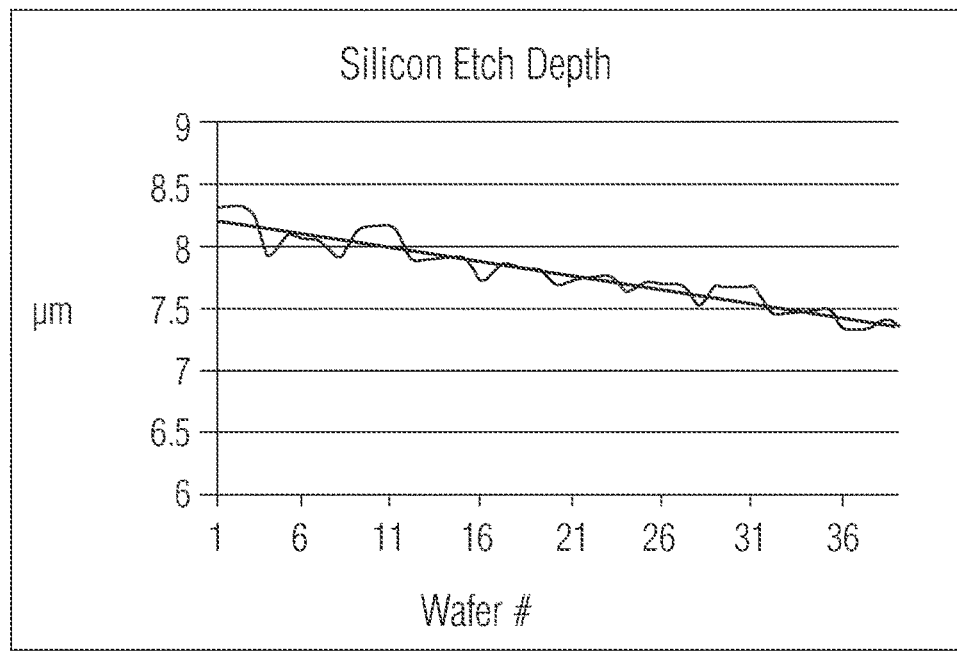
FIG. 1 is a diagram showing the silicon etch depth for constant etch conditions including etch time and a single batch of chemistry.
Figure 2:
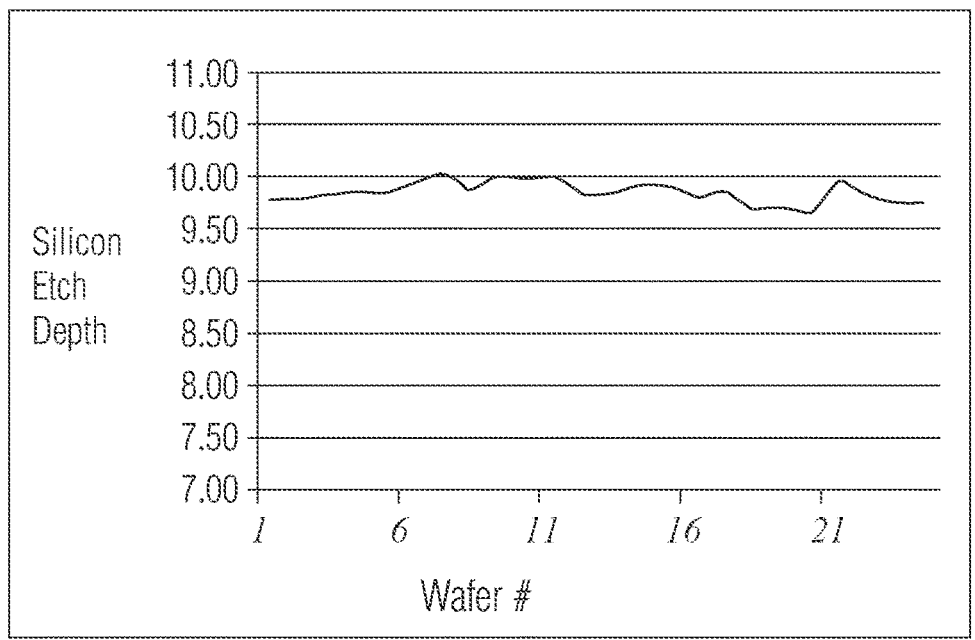
FIG. 2 is a diagram showing the silicon etch depth with addition of chemicals to maintain a constant etch rate.
Figure 3A:
FIG. 3A shows a cross-sectional view of a first wafer (W10) both prior to and subsequent to the wafer undergoing a first etch process.
Figure 3B:
FIG. 3B shows a cross-sectional view of a second wafer (W20) both prior to and subsequent to the wafer undergoing the same first etch process as in FIG. 3A.
Figure 3C:
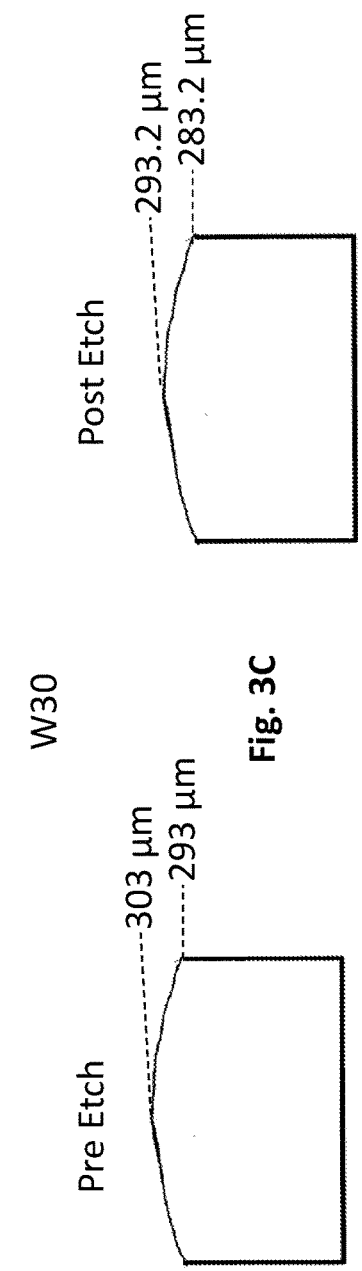
FIG. 3C shows a cross-sectional view of a third wafer (W30) both prior to and subsequent to the wafer undergoing the same first etch process as in FIGS. 3A and 3B.
Figure 4A:
FIG. 4A shows a cross-sectional view of the first wafer (W10) both prior to and subsequent to the wafer undergoing a second etch process which includes addition of chemicals (spiking) to maintain constant etch rate.
Figure 4B:
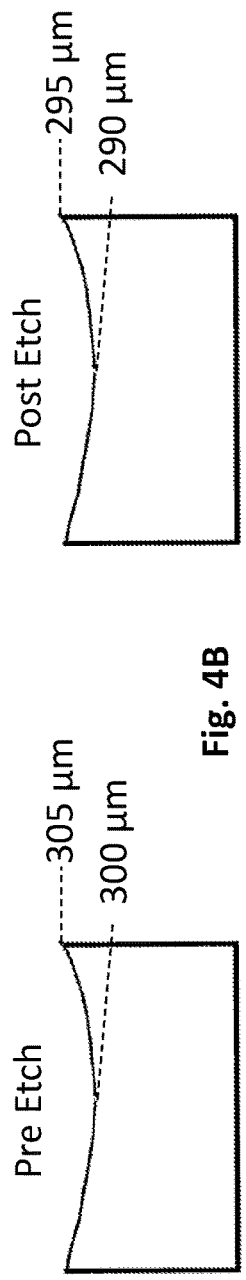
FIG. 4B shows a cross-sectional view of the second wafer (W20) both prior to and subsequent to the wafer undergoing the second etch process which includes addition of chemicals (spiking) to maintain constant etch rate.
Figure 4C:
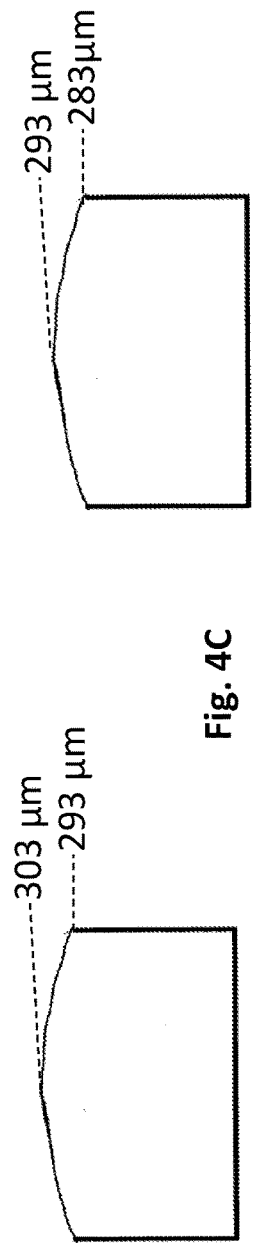
FIG. 4C shows a cross-sectional view of the third wafer (W30) both prior to and subsequent to the wafer undergoing a second etch process which includes addition of chemicals (spiking) to maintain constant etch rate.

The present embodiment relates to a system 100 and method for performing a wet etching process and in particular, a system and method for maintaining etch rate on a single wafer etch tool by implementing an adaptive spiking program in which the spike dosage for a particular wafer is based upon the unique etch profile the given wafer. The system 100 can in one aspect be thought of as being a wet-etching facility for manufacturing semiconductor devices. Example wet processing systems are disclosed in U.S. patent application Ser. No. 13/780,657 filed on Feb. 28, 2013 and entitled "System and Method for Performing a Wet Etching Process", U.S. patent application Ser. No. 13/922,735 filed on Jun. 20, 2013 and entitled "Apparatus and Method for Challenging Polymer Films and Structures from Semiconductor Wafers", U.S. patent application Ser. No. 11/640,044 filed on Dec. 15, 2006 and entitled "Apparatus and Method of Chemical Separation", U.S. patent application Ser. No. 14/457,645 filed on Aug. 12, 2014 and entitled "Collection Chamber Apparatus to Separate Multiple Fluids During the Semiconductor Wafer Processing Cycle", and U.S. patent application Ser. No. 09/841,231 filed on Apr. 24, 2001 and entitled "Megasonic Treatment Apparatus", all of which are incorporated by reference herein in their entirety.

In a wafer wet treatment process of a semiconductor device manufacturing process, there are generally an etching process and a cleaning process. A single wafer wet treatment apparatus used in an etching process dispenses chemical etchant in a controlled manner on a substrate for inducing a chemical reaction during a fixed time. It will be understood that the terms "wafer" and "substrate" are used interchangeably herein. A single wafer wet treatment apparatus used in a cleaning process causes a chemical solution to be dispensed onto a substrate and can also include a scrubbing device to mechanically scrub the substrate. Typically cleaning fluids are single pass and etchants are recycled. The single wafer wet treatment apparatuses are further composed of conduits (e.g., pipes) which supply or discharge fluids (e.g., chemicals, water, solutions and the like) in the bath, and various kinds of control means for controlling fluid temperature or concentration and other process parameters as further described herein. The wafer wet treatment process can also include a measuring step whereby the wafers are measured for thickness as described herein.

The system 100 can be an integrated system that is defined by a number of different devices (equipment pieces) that are located at different stations within a housing. One exemplary system 100 is described in U.S. patent application publication No. 2014/0242731, which is hereby incorporated by reference in its entirety.

The system 100 includes a measuring station/chamber 110 (wafer inspection station) in which a property of the wafer can be measured and in particular, the thickness of the wafer can be measured. The measuring station 110 thus includes a measuring device 120 for measuring one or more properties of a wafer. Any number of different types of measuring devices can be used. In accordance with one embodiment of the present embodiment, the measuring device 120 can be in the form of an imaging device that is configured to measure one or more properties (e.g., wafer thickness and surface profile) of the wafer.

One exemplary measuring (imaging) device 120 can include a platform for receiving and holding a wafer in a fixed orientation (e.g., in a horizontal orientation). The platform can be of an adjustable type to accommodate different sized wafers. For example, the diameters of wafers can vary considerably and thus, the platform is constructed to allow different sized wafers to be placed and supported thereon. In addition, the platform can move in any number of different directions (x, y, z) (i.e., the platform has multiple degrees of freedom of movement) and is rotatable such that the wafer can be rotated during the measuring process.

The imaging device 120 also includes a non-contact measurement component that measures at least the thickness of the wafer and is also configured to detect (measure) and generate a surface profile for the wafer. The non-contact measurement component includes imaging equipment and can be part of an automated device to allow movement of the component with respect to the wafer on the platform. For example, the non-contact measurement component can be in the form of an arm or the like that can move in any number of different directions (x, y, z) with respect to the wafer (i.e., the component has multiple degrees of freedom of movement). Alternatively or in addition, the component can be held in a stationary position and platform supporting the wafer can be moved in any number of different directions (x, y, z) with respect to the component and/or rotated.

The non-contact measurement component includes one or more sensors, such as an optical sensor (e.g., an IR light sensor) and a light source that is directed at the surface of the wafer. The reflected light (after contacting the wafer) is collected by the imaging device and based on the collected information (and after processing thereof in accordance with execution of software), a number of different measurements of the wafer can be taken and recorded. More particularly, light is reflected at the top and bottom of each surface in the film stack (the layers of material that form the wafer) and the distance in reflected light is corrected according to the refractive index of the material in order to calculate depth. For example, the imaging device can measure the following properties (which is not an exhaustive list): wafer thickness; bow, warp, flatness; surface roughness; total thickness variation (TTV); optical inspection pattern recognition; and TSV depth, etc. One commercial source for one or more components of the imaging device is ISIS Sentronics gmbH, Germany however, other commercial sources are available.

A wafer transfer device (robot) 270 can be provided to move, in an automated manner, the wafer between the various stations.

Another station 200 is an etch station in which the wafer undergoes the single wafer wet etching process. As mentioned before, a single wafer wet etching process is generally performed by dispensing a certain amount of chemical etchant onto a wafer disposed within the station, and causing a chemical reaction with a contacted surface of the wafer so that the unnecessary portion of the contacted surface is etched by the chemical.

The etch station 200 includes a single wafer wet etching apparatus 210 that includes an etch chamber (enclosure) that contains the equipment and chemical etchant used in the wet etching process. The etch chamber can thus be thought of as a chemical containment structure. The enclosure also collects and contains the chemicals used in the etching process.

The wet etching apparatus 210 also includes spin chuck (variable speed controlled by an etch controller which is part of the overall process control system described herein) on which the wafer rests, as well as an etch tool (arm) 215 that includes one or more nozzles (orifice) that dispenses a fluid (e.g., one or more liquids, preferably the chemical etchant). The etch tool 215 can be in the form of an arm that is movable along multiple directions (x, y, z directions) and thus, has multiple degrees of freedom. The etch tool 215 is a controllable tool in that it is controlled by a computing device such as etch controller 250 and is part of the overall programmable computer system employed in the system 100 as described herein. As a result, the etch tool 215 can be driven to any specific location of the wafer, etc.

The wet etching apparatus 210 also includes a fluid delivery and fluid removal system for both introducing the etch chemicals and removing such chemicals from the chamber. These components are implemented using a conventional fluid plumbing scheme in which conduits are provided for supplying fluid (e.g., one or more liquids, preferably a chemical etchant) to the nozzle. In addition, the wet etching apparatus 210 includes conduits and mechanisms for discharging fluid(s) that accumulate within the enclosure during the wet etching process.

The mechanical chuck permits the chuck to hold the wafer. The chuck includes a main shaft (not shown) which can be joined to a driving shaft of a motor so as to allow the wafer held by the spin chuck to make a spin rotation about a Z-axis. A power source switch of the motor is connected to an output side of the etch controller 250, with the result that the rotation speed of the motor is controlled by the controller 250.

Traditionally, around the outer periphery and bottom portion of the spin chuck a structure is provided for receiving and collecting the etchant solution, which is centrifugally separated from the wafer and is then discharged to the outside. Part of the mechanism for discharging fluid(s) from the enclosure can be an exhaust gas passageway and drain pipes that are formed in the bottom portions of the collector structure that surrounds the chuck. The liquid stored in the collector structure can be discharged to the outside through one or more drain pipes or re-circulated.

In accordance with the present embodiment, any number of suitable etching solutions can be used so long as they are suitable for a wet etching process and for the intended substrate and application. Thus, different chemistries can be used based on a number of different parameters, including in view of the properties of the wafer.

With respect to the delivery of the etchant solution, the wet etching apparatus 210 also includes means for controlling the flow properties (flow rate) and temperature of the etchant solution. The operating system can include one or more first flow rate control sections, including but not limited to a pump or valve, that extend from a liquid supply source to a nozzle. The operating section of the flow rate control section can be connected to the output side of the etch controller 250 so as to control the flow rate of the etchant solution supplied to the nozzle. In addition, other control mechanism can be used to control the concentration of the etchant solution. The control of the concentration of the etchant is one means for controlling the overall etch rate and etch process for a given wafer.

Figure 6:
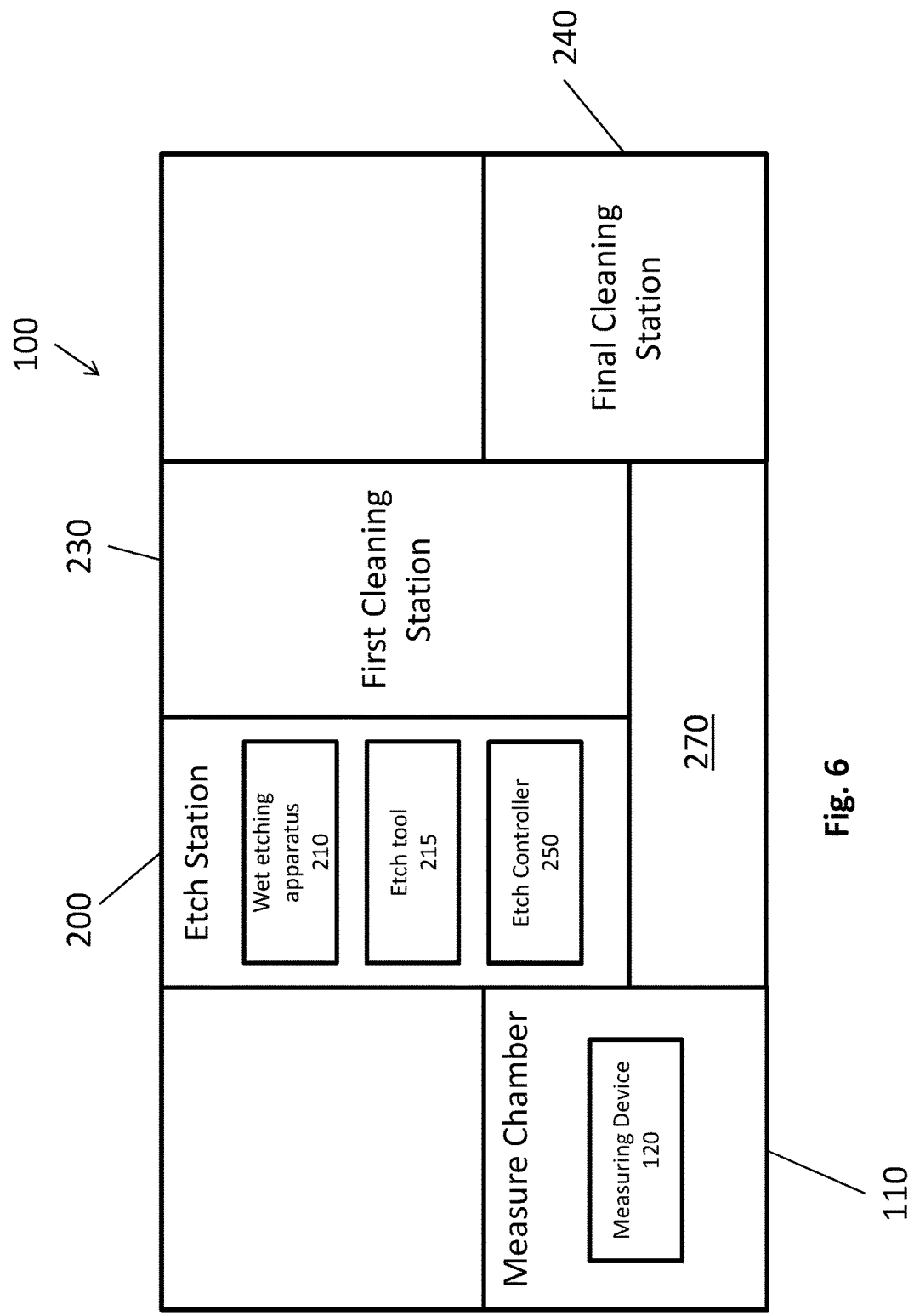
FIG. 6 is a block diagram showing an exemplary configuration of a system for performing a wet etching process in accordance with one embodiment disclosed herein.

After the wafer undergoes processing at the etch station 200, the wafer is then cleaned at one or more wafer cleaning stations. FIG. 6 shows two distinct cleaning stations 230, 240; however, this is merely representative of one embodiment and it will be appreciated that a single cleaning station can be used. In such a construction, the single cleaning station can still employ one or more different cleaning techniques for cleaning the wafer. In one or more embodiments, the first cleaning step (at station 230) can involve a scrubbing process using one or more cleaning apparatuses which primarily remove the larger particles and residual etchant. The wafer can then be transferred wet from the first cleaning station 230 to the cleaning station 240. The cleaning station 240 can be a physically different station that is located proximate to the cleaning station 230 and is of a type in which the wafer is subjected to a different cleaning process than the one employed in the cleaning station 230. The cleaning station 240 can be thought of as being a final clean station. For example, the cleaning station 240 can involve the removal of small particles (using the cleaning apparatus) from the wafer surface. In addition, station 240 can include a drying apparatus to dry the wafer at the end of the final cleaning process.

In at least one embodiment, the system 100 can include one more wafer holding and loading devices for holding wafers (substrates) in a sealed and secure manner. Any number of different conventional wafer holding and loading devices can be used in system 100.

The Wet Etch Process Using System 100

Figure 7A:
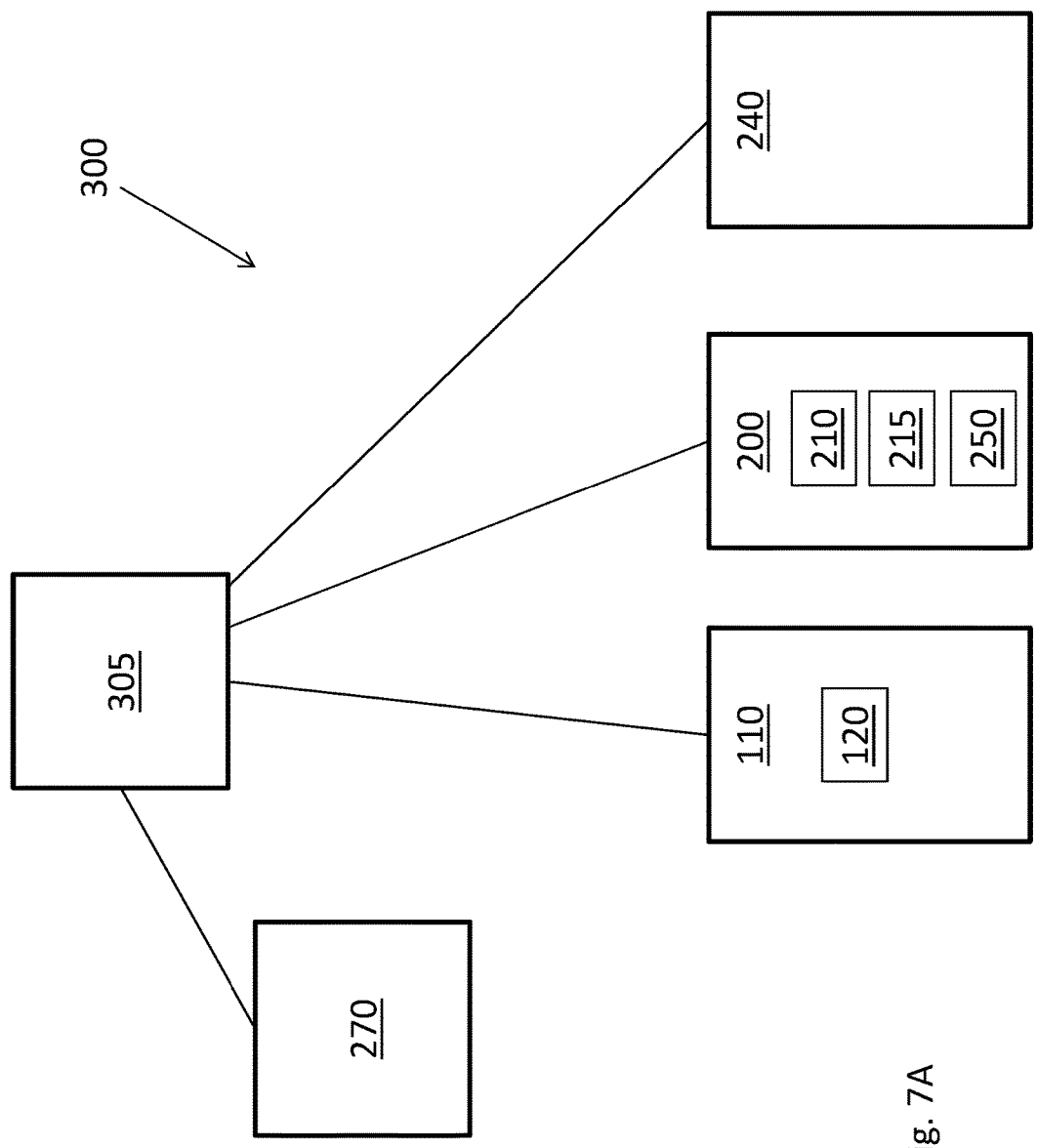
FIG. 7A is a block diagram showing an exemplary configuration of a system for performing a wet etching process in accordance with one embodiment disclosed herein.

FIG. 7A is a high-level diagram illustrating an exemplary configuration a process control system 300 for use with the system 100 for performing a wet etching process. In one arrangement, the process control system consists of one or more computing devices including a process controller 305. It should be understood that process controller 305 can be practically any computing device and/or data processing apparatus capable of embodying the systems and/or methods described herein.

Process controller 305 can be configured to communicate with the various computer-controlled components of the system 100, including the various stations described herein, and the computer controlled devices or controllers associated therewith including but not limited to a wafer transfer device and the etch controller 250, whereby the process controller 305 transmits electronic information to and receives electronic information from the various components.

Figure 7B:
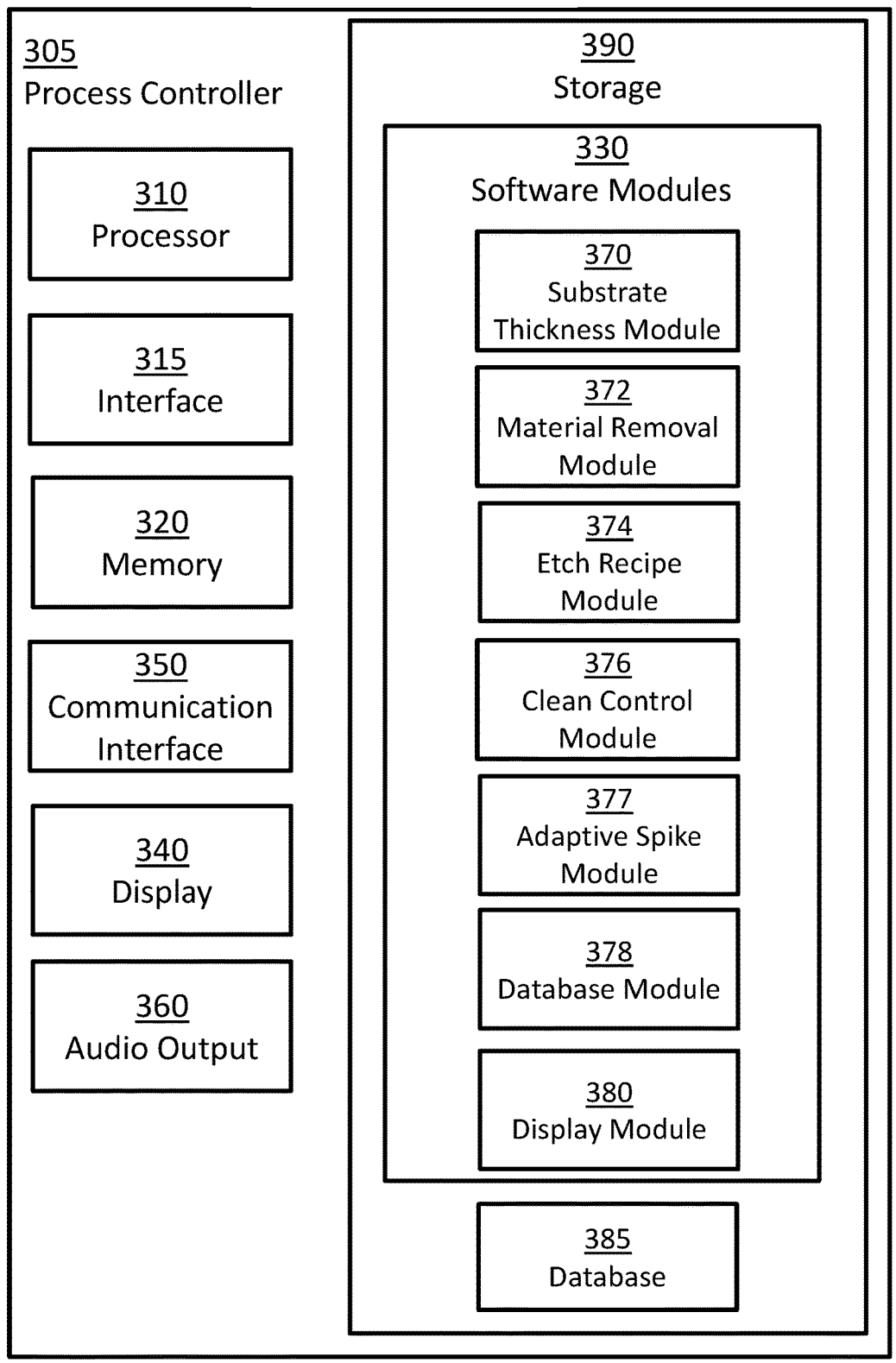
FIG. 7B is a block diagram showing an exemplary configuration of a process control system in accordance with one embodiment disclosed herein.

FIG. 7B is a block diagram illustrating an exemplary configuration of process controller 305 of the system 100 for performing a wet etching process. Process controller includes various hardware and software components that serve to enable operation of the system, including a processor 310, memory 320, display 340, storage 390 and a communication interface 350. Processor 310 serves to execute software instructions that can be loaded into memory 320. Processor 310 can be a number of processors, a multi-processor core, or some other type of processor, depending on the particular implementation.

Preferably, memory 320 and/or storage 390 are accessible by processor 310, thereby enabling processor to receive and execute instructions stored on memory and/or on storage. Memory can be, for example, a random access memory (RAM) or any other suitable volatile or non-volatile computer readable storage medium. In addition, memory can be fixed or removable. Storage 390 can take various forms, depending on the particular implementation. For example, storage can contain one or more components or devices such as a hard drive, a flash memory, a rewritable optical disk, a rewritable magnetic tape, or some combination of the above. Storage also can be fixed or removable.

One or more software modules 330 are encoded in storage 390 and/or in memory 320. The software modules can comprise one or more software programs or applications having computer program code or a set of instructions executed in processor 310. Such computer program code or instructions for carrying out operations for aspects of the systems and methods disclosed herein and can be written in any combination of one or more programming languages. The program code can execute entirely on process controller 305, as a stand-alone software package, partly on process controller, or entirely on another computing/device or partly on another remote computing/device. In the latter scenario, the remote computing device can be connected to process controller through any type of direct electronic connection or network, including a local area network (LAN) or a wide area network (WAN), or the connection can be made to an external computer (for example, through the Internet using an Internet Service Provider).

Preferably, included among the software modules 330 is a substrate thickness module 370, a material removal module 372, an etch recipe module 374, a clean control module 376, an adaptive spiking module 377, a database module 378 and display module 380 that are executed by processor 310. During execution of the software modules 330, the processor configures the process controller 305 to perform various operations relating to the system 100 for performing a wet etching process, as will be described in greater detail below.

It can also be said that the program code of software modules 330 and one or more computer readable storage devices (such as memory 320 and/or storage 390) form a computer program product that can be manufactured and/or distributed in accordance with the present embodiment, as is known to those of ordinary skill in the art.

It should be understood that in some illustrative embodiments, one or more of software modules 330 can be downloaded over a network to storage 390 from another device or system via communication interface 350 for use within the system 100. In addition, it should be noted that other information and/or data relevant to the operation of the present systems and methods (such as database 385) can also be stored on storage, as will be discussed in greater detail below.

Also preferably stored on storage 390 is database 385. As will be described in greater detail below, database contains and/or maintains various data items and elements that are utilized throughout the various operations of the system 100. The information stored in database can include but is not limited to, parameter adjustment algorithms, recipes, chemical mixture details, settings, alarms, actual values for process variables, and historical data collected and analyzed by the process controller (e.g., batch records, substrate thickness measurement information, via depth measurement information) as will be described in greater detail herein. It should be noted that although database is depicted as being configured locally to process controller 305, in certain implementations database and/or various of the data elements stored therein can be located remotely (such as on a remote computing device or server—not shown) and connected to process controller through a network or in a manner known to those of ordinary skill in the art.

An interface 315 is also operatively connected to the processor 310. The interface can be one or more input device(s) such as switch(es), button(s), key(s), a touchscreen, microphone, etc. as would be understood in the art of electronic computing devices. Interface serves to facilitate the capture of commands from the user such as on-off commands or settings related to operation of the system 100.

Display 340 is also operatively connected to processor 310. Display includes a screen or any other such presentation device which enables the user to view information relating to operation of the system 100 including control settings, command prompts and data collected by various components of the system 100 and provided to process controller. By way of example, display can be a digital display such as a dot matrix display or other 2-dimensional display.

By way of further example, interface and display can be integrated into a touch screen display. Accordingly, the screen is used to show a graphical user interface, which can display various data and provide "forms" that include fields that allow for the entry of information by the user. Touching the touch screen at locations corresponding to the display of a graphical user interface allows the person to interact with the device to enter data, change settings, control functions, etc. So, when the touch screen is touched, interface communicates this change to processor, and settings can be changed or user entered information can be captured and stored in the memory.

Audio output 360 is also operatively connected to the processor 310. Audio output can be any type of speaker system that is configured to play electronic audio files or generate audio tones as would be understood by those of ordinary skill in the art. Audio output can be integrated to the process controller 305 or external to the process controller 305.

Communication interface 350 is also operatively connected to the processor 310 and can be any interface that enables communication between the process controller 305 and external devices, machines and/or elements including [robot, imaging device, etch controller, clean controller, chemistry controller]. Preferably, communication interface includes, but is not limited to, Ethernet, IEEE 1394, parallel, PS/2, Serial, USB, VGA, DVI, SCSI, HDMI, a Network Interface Card (NIC), an integrated network interface, a radio frequency transmitter/receiver (e.g., Bluetooth, cellular, NFC), a satellite communication transmitter/receiver, an infrared port, and/or any other such interfaces for connecting process controller 305 to other computing devices and/or communication networks such as private networks and the Internet. Such connections can include a wired connection (e.g. using the RS232 standard) or a wireless connection (e.g. using the 802.11 standard) though it should be understood that communication interface can be practically any interface that enables communication to/from the process controller 305.

At various points during the operation of the system 100 for performing a wet etching process, process controller 305 can communicate with one or more computing devices, for instance, computing devices used to operate the various process stations and constituent devices as will be further described in greater detail herein. Such computing devices can transmit and/or receive data to/from process controller 305 and between one another, thereby preferably initiating maintaining, and/or enhancing the operation of the system 100, as will be described in greater detail below.

As mentioned herein, the present embodiment is directed to an apparatus and method for maintaining etch rate on a single wafer wet etch tool. The etch rate is maintained through the addition of those chemistries being depleted during the etch process. This technique adapts the magnitude of the spiking charge (i.e., the amount of chemistry being added) based upon the unique etch profile calculated on a per wafer basis. As described herein, once the etch profile for the wafer undergoing treatment is determined, then the correct (target) chemistry dosage is determined for this particular product run in which the wafer is etched.

As mentioned above, in accordance with the present embodiment, the software modules 330 can include an adaptive spiking module 377 which calculates the spike dosage (spiking charge) that is to be added back to the chemistry after performing the etch on the wafer being evaluated as described in greater detail below. Unlike the conventional chemistry spiking protocol which refreshes the chemistry by adding a given constant amount (volume) of chemistry after each wafer is etched regardless of the profile of the wafer, the present embodiment etches the wafer based on the unique etch profile that is calculated for each wafer as described below.

Figure 8:
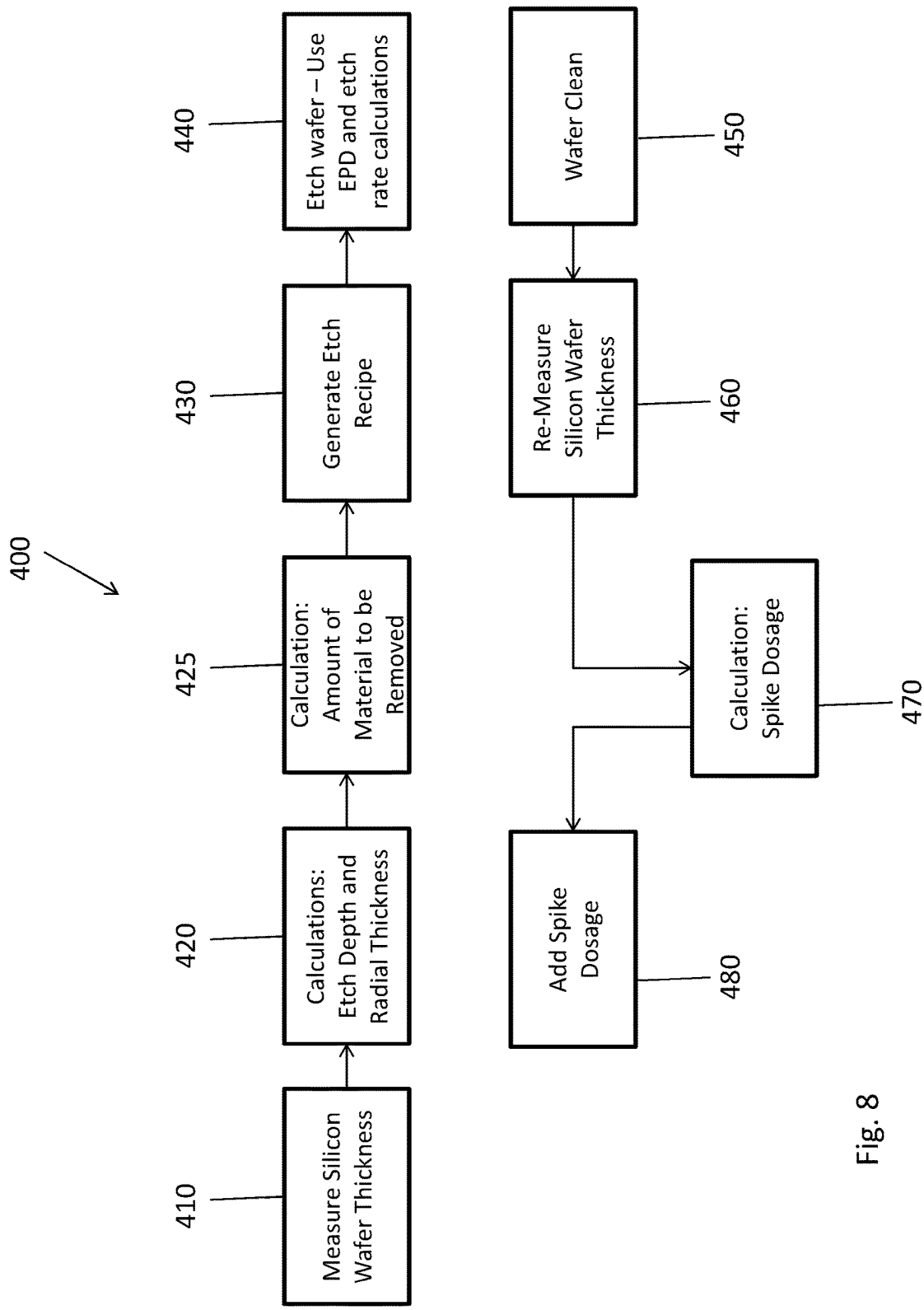
FIG. 8 is a flow diagram showing a routine for performing a wet etching process in accordance with at least one embodiment disclosed herein.

The operation of the system 100 for performing a wet etching process and maintaining etch rate within tight tolerances, and the various elements and components described above will be further appreciated based on the following discussion, in conjunction with FIG. 8.

FIG. 8 is a flowchart illustrating a process flow 400 for etching wafers using system 100 in accordance with an embodiment of the embodiment. It should be understood that the exemplary process can be performed on post grind TSV substrates (i.e., wafers) in which the TSVs are not exposed on the top surface of the substrate due to a layer of overburden and also, as described below, can be performed on non-TSV wafers. Moreover, the bottom surface of the substrate is mounted to a carrier with an adhesive layer that can vary in thickness from one substrate to another. However, it should be understood that substrates are not limited to this particular carrier configuration as the exemplary process is operable on substrates in alternative carrier configurations and non-carrier configurations as would be understood by those skilled in the art. The exemplary process provides specialized metrology to determine the thickness of the overburden and wet etch substrates using the system 100 to expose the TSVs to a desired depth and substrate surface uniformity. Although process flow is generally discussed in relation to TSV substrates, it should be understood that the exemplary process can be performed on non-TSV substrates and provides specialized metrology to determine the thickness of the substrate and wet etch non-TSV substrates using system 100 to a desired thickness and substrate surface uniformity.

In process block 410, the system 100 measures the thickness of a particular substrate. In process block 420, the system calculates the etch depth and radial thickness for the particular substrate in accordance with the thickness measurements taken in process block 410. In process block 425, the system calculates the amount of material to be removed during the etching process for the particular substrate in view of the etch profile calculated in step 420. In process block 430, the system generates an etch recipe for the particular substrate to achieve the desired etch profile for the particular substrate. In process block 440, the system etches the particular substrate according to the etch recipe. In process block 450, the system cleans the substrate to remove any residual particles, ions and etchant. In process block 460, the system preferably remeasures the thickness of the particular substrate and provides the thickness measurements to the process controller to analyze the physical properties of the substrate, evaluate the efficacy of the etch recipe, and optionally adjust the etch recipe for subsequent substrates being put through process flow 400 accordingly. In process block 470, the system calculates the spike dosage (spiking charge) that is to be added back to the chemistry following the etching of the substrate. In process block 480, the system adds the spike dosage (spiking charge) to the chemistry.

It should be appreciated that more or fewer operations can be performed than shown in the figures and described herein. These operations can also be performed in a different order than those described herein, combined into multi step processes or broken into sub-routines. For example, step 470 can be performed immediately after etching the wafer as recited in step 440, but before step 450 wafer clean. The steps are described in the context of system 100 however practice of the steps is not limited to the exemplary configuration of system 100 as described in FIGS. 6, 7A, and 7B.

The process begins at block/step 410 (FIG. 8), where processor 310 executing one or more of software modules 330 configures process controller 305 to cause imaging device to collect thickness information for a particular substrate.

In the case of an exemplary post grind TSV substrate, the substrate includes a top surface, a bottom surface mounted to a carrier by an adhesive layer and TSVs spaced throughout the substrate. The grinding process leaves a layer of overburden (e.g., substrate material above the TSVs) that can vary in thickness (i.e., thicker at the edge, uniform across the substrate or thicker at the center of the substrate than at the edge) (within substrate thickness variation). Likewise, there can be a difference in height of the substrate material above the TSVs on a substrate to substrate basis (substrate to substrate thickness variation). These differences in the layer above the TSVs can be greater than the allowable difference in height of the exposed vias. In addition, the adhesive layer can also vary in thickness and uniformity, rendering exterior measurements ineffective at determining the thickness and uniformity of the material remaining in the top silicon substrate, above the end of the via.

As mentioned herein, the present embodiment is particularly suited for etching non-TSV substrates and in particular, for performing a post grind stress relief (to remove grind marks and surface damage).

An imaging device (measuring device 120) measures the actual thickness of the substrate over the surface by optically scanning the substrate. Various methods of optically scanning the substrate to determine thickness information (which can include the substrate's thickness, total thickness variation (TTV, which represents the difference between the minimum and maximum thickness measured on the substrate), substrate flatness (e.g., wafer bow), surface roughness and otherwise analyze the topography of a substrate) are known by those skilled in the art and are suitable for use in the present embodiment. Preferably, imaging device scans a representative sample of the surface of the substrate and collects thickness information, including preferably, the substrate thickness over the representative sample and transmits the thickness information to process controller 305. The sample size (number of data-points collected over the substrate surface) can be adjusted depending on the level of detail required by the application of the processed substrate, and can range from a detailed scan of the entire surface to just a few data points over the surface. More specifically, thickness measurements can be collected at various locations on a substrate, and the measurements can be used to interpolate the thickness at intermediate locations as a function of the distance between the two data points. In other words, the software of the present embodiment can perform an interpolation operation for generating such measurements.

Processor 310 executing one or more software modules 330 including, preferably imaging module 370 or database module 378, can also configure the process controller 305 to record the thickness information to storage 390 or memory 320 for further processing as further described herein.

Then at step 420, processor 310 executing one or more of software modules 330, including, preferably substrate thickness module 370, configures process controller 305 to determine the thickness of the particular substrate and etch depth to identify the radially defined areas of the surface of the particular substrate where the substrate is thicker or thinner (e.g., edge heavy, uniform or center heavy) and the amount of material to be removed at a given radius. In one or more embodiments, the determined thickness of the particular substrate is a radial thickness. In at least one embodiment, the determined thickness of the substrate is based on the thickness of a substrate along its diameter. In one or more embodiments, the thickness, etch depth, and other measurements of the substrate are determined using the measuring device 120, and these measurements are subsequently used to determine the etch profile and etch recipe for the particular substrate. Radial thickness is the average thickness of the substrate at a given radius. Similarly, surface uniformity of the particular substrate is a measure of how radial thickness varies across the surface of the wafer. Radial thickness is used to identify radial dependent non-uniformities in thickness i.e., at what radial areas on the surface of the substrate the overburden must be removed more than others. Radial thickness can be calculated according to an algorithm that is a function of the average thickness of the particular substrate measured at step 410 around a given radius of the substrate.

In one or more embodiments, the radial thickness is the average thickness at a defined number of points along a radius of the substrate. More specifically, the measuring device 120 measures the thickness at a defined number of points along a radius of the substrate. The measured thickness at each of these defined points is then averaged to determine the average thickness along the radius. The determined average thickness along a radius of the substrate is then used to generate an etch recipe by comparing the average radial thickness with the desired dimensions of the substrate following etching (final etch profile). In this embodiment, it is assumed that the substrate has reflection symmetry (bilateral symmetry), such that the average thickness for a radius of the substrate also estimates the thickness of the opposing radius of the substrate (relative to the middle point of the substrate).

In at least one embodiment, the determined thickness of the substrate is based on the average thickness of a substrate along its diameter. In this embodiment, a defined number of points along a diameter of the substrate are determined, where each point on one side of the diameter (relative to the middle of the diameter) has a corresponding point on the other side of the diameter. An average thickness is then determined between each point and its corresponding point on the other side of the diameter. These averages are then combined to determine an average thickness of the substrate along the entire radius.

Etch depth is the desired depth of material to be removed from the surface of the substrate. The method of determining etch depth can vary depending on the type of substrate and intended application of the substrate.

In the case of etching substrates to reveal TSV's, etch depth is the thickness of the overburden between the top surface of the substrate and the top of the TSVs. In addition, etch depth can also be a function of the desired height of the revealed TSVs (TSV reveal height). Preferably, etch depth is determined for a sample of radial locations on the surface of the particular substrate according to an algorithm that subtracts a reference height of the TSVs and desired TSV reveal height from the radial thickness. Accordingly, etch depth is a function of radius and can be adjusted to minimize radial dependent non-uniformities in overburden thickness.

The reference height of the TSVs in the particular substrate can be obtained from the manufacturer of the particular substrate. Alternatively, or in addition, the reference height can also be a function of measurements of the actual height of the TSVs of one or more etched substrates.

In the case of etching non-TSV substrates, for example, a wafer thinning process, etch depth can be calculated as a function of radial thickness and other thickness related information, including TTV (total thickness variation). Accordingly, etch depth can be adjusted to improve the overall thickness uniformity, surface uniformity of the non-TSV substrates being etched.

Then at step 425, processor 310 executing one or more software modules 330, including preferably material removal module 372, can configure process controller 305 to calculate the amount of material to be removed from the particular substrate during the etch process. The amount of material to be removed during the etch process can be calculated in any number of different ways. In at least one embodiment, the amount of material to be removed can be calculated using an algorithm. In one or more embodiments, the algorithm uses the measurements of step 410 and/or calculations of step 420 for the particular substrate to calculate the amount of material to be removed during the etch process. In at least one embodiment, the algorithm uses the etch profile and/or the etch recipe (described in greater detail below) for the particular substrate to calculate the amount of material to be removed during the etch process. Further, it should be understood that, in this embodiment, the amount of material to be removed is a target value corresponding to the amount of material that will be removed from that particular substrate during the etching process. In other words, the target value is the amount of material that is removed from the wafer as a result of etching the wafer from the calculated etch profile to the final etch profile. Accordingly, this target value is a calculated value and in at least one preferred embodiment, thus constitutes an unverified approximation of the amount of material to be removed upon etching.

Then at step 430, processor 310 executing one or more software modules 330 (e.g., preferably etch recipe module 374 and, in at least some system configurations, the adaptive spiking module 377) can configure process controller 305 to generate an etch recipe for the particular substrate that can be executed by the etching apparatus to etch the particular substrate to obtain the desired etch profile.

In general, the etch profile can include etch depth as determined in step 420. Etch profile can also include other changes that need to be made to the particular substrate to achieve the desired physical characteristics including but not limited to surface roughness. Accordingly, etch profile is a function of application dependent physical characteristics of the processed substrate, by example and without limitation, desired surface roughness, desired TSV reveal height, desired substrate thickness, and also a function of actual physical characteristics of the particular substrate including via depths and radial thickness. The etch recipe is generated according to an algorithm which is a function of the etch profile of the particular substrate. The etch recipe consists of a variety of single wafer wet etch process control parameters relating to the radial location on the surface of the particular substrate where material should be removed and the amount of material to remove so as to achieve the desired etch profile.

A variety of parameters can be adjusted to control the radial location on the surface of the substrate where etching is concentrated, including but not limited to the radial position of the etch tool 215 (also referred to as the arm) and a nozzle dispensing the chemical etchant onto the substrate, arm scan speed, acceleration, deceleration and nozzle height. It is understood that dispensing an etchant onto a substrate at a particular radial location generally localizes the etching process to that particular radius of the substrate and as such the position and movement of the arm and nozzle controls the location of etching. Arm scan speed is the speed at which the arm and nozzle dispensing the chemical etchant moves from one position on the substrate to another, and acceleration and deceleration is the rate of change of the arm scan speed over a period of time, and the nozzle height is the distance between the nozzle and the substrate.

The parameters that can be adjusted to control etch rate (i.e., the rate at which the substrate material is chemically removed), include but are not limited to, the spin speed of the substrate, the concentration of the chemical etchant, the temperature of the chemical etchant, and dwell time. Spin speed is the speed at which the chuck and the substrate thereon are spinning while chemical etchant is being deposited on the substrate surface.

The chemical etchant concentration is the concentration of the chemical etchant that is used to chemically remove the top surface of the substrate. One chemistry commonly used for isotropic wet etching of silicon is a combination of nitric acid and hydrofluoric acid (HF), along with other diluting agents not involved in the stoichiometry of the reaction. As mentioned herein, the nitric acid acts as an oxidizer to convert the surface into silicon dioxide and then the HF etches (dissolves) the oxide. The reaction proceeds as shown below and has been well documented in the literature.

$$Si+4HNO_3 \rightarrow SiO_2+4NO_2+2H_2O$$

$$SiO_2+6HF \rightarrow H_2SiF_6+2H_2O$$

It will be understood that other etchants can be used depending upon the particular application.

The parameters that can be adjusted to control the etch uniformity (i.e., the uniformity of the radial thickness of the resulting substrate) include but are not limited to, the spin speed of the substrate and the dwell time of the arm depositing chemical etchant on the radial; locations of the substrate being etched.

Dwell time is the amount of time the nozzle is dispensing the etchant on a particular radial portion of the substrate. Increasing dwell time at a particular radius of the substrate causes the substrate to be etched more at that radius. Dwell time can be controlled by adjusting process parameters discussed above such as arm scan speed, acceleration and the spin speed of the chuck. More specifically, due to the circular shape of the substrate that is spinning on the chuck during the etching process, less time is required to deposit the chemical etchant necessary to etch the center of the substrate than the edge of the substrate and as such the speed of the arm, acceleration/deceleration between one radial position to another over the substrate is adjusted to vary the amount of time the etchant is dispensed at a particular location. The arm scan speed as a function of distance from the center of the substrate to achieve a uniform dwell time over the entire surface of the substrate can be represented by a hyperbolic motion profile that can be used to achieve the uniform dwell time. The hyperbolic motion profile provides the basis for variations in arm scan speed and acceleration to change the dwell time over a particular location of the substrate as would be understood by those skilled in the art.

Returning to FIG. 8, in particular step 430, processor executing one or more software modules 330, including preferably etch recipe module 374 and the adaptive spiking module 377, can configure process controller 305 to define one or more of the aforementioned parameters that control etching location, surface roughness, etch rate, dwell time and surface uniformity to generate an etch recipe to selectively etch the overburden in various radial locations on the surface of the particular substrate to achieve the desired etch depth, radial thickness and surface roughness. It should be understood that the parameters can be defined as a function of etching location or other variables and are therefore variable throughout the course of the etching process. For example, in a substrate with a radial thickness that is, say, edge heavy, dwell time can be increased near the edge of the substrate, and spin speed can be decreased to achieve a greater etch depth at the edge.

Additionally, the etch recipe can include an etch duration. Etch duration is the amount of time that the etch process is being performed on the particular substrate and can be varied to control the amount of material that is removed during the etching process. The longer a given etch recipe is executed on a substrate the more substrate is removed and as such, the overall thickness is reduced.

Then at step 440, processor 310 executing one or more software modules 330, including preferably etch recipe module 378, can configure process controller 305 to cause the etching apparatus 210 to etch the substrate according to the etch recipe. In one or more embodiments, a Profile Match Technology is used to control the etching apparatus 210 to deliver the required etch profile on the wafer at the proper depth.

Then at step 450, processor 310 executing one or more software modules 330, including preferably cleaning module 370, can configure the process controller 305 to cause one or more cleaning apparatuses in the cleaning station(s) 230/240 to clean the substrate to eliminate residual etchant, ions and other particles from the surface of the substrate. In addition, process controller can cause the cleaning apparatus(es) to perform a final clean process to remove small particles from the substrate surface and cause a drying apparatus to dry the wafer at the end of the final cleaning process.

Then at step 460, processor 310 executing one or more software modules 330, including preferably imaging module 370, can configure the process controller 305 to cause the imaging device (measuring device) 120 to re-measure the thickness of the particular substrate, as discussed in relation to step 410 and transmit the thickness information to process controller 305. In at least one embodiment, processor 310 executing one or more software modules 330, including preferably etch recipe module 374, can then optionally configure the process controller 305 to analyze the thickness information obtained at step 460 to adjust the etch profile and/or etch recipe for subsequent substrates to undergo the etching process according to the disclosed embodiments. More specifically, the process controller can compare the post-processing thickness information to the pre-processing thickness information to determine whether the etch recipe executed by etching apparatus 210 successfully etched the desired amount of substrate at the desired locations and at the desired etch rate and resulted in a processed substrate having the desired physical characteristics, including surface uniformity. In addition, information about the actual height of the vias can be used to adjust the reference via height as discussed above. Depending on the etch rate and thickness information, the process controller can adjust the etch recipes for subsequent substrates, or adjust parameters to maintain a consistent etching environment such as restore the concentration of the chemical etchant and adjust chemical etchant temperature as would be understood by those skilled in the art.

Then at step 470, processor 310 executing one or more software modules 330, including preferably adaptive spiking module 377, can configure the process controller 305 to calculate the spike dosage (spiking charge) that is to be added back to the chemistry after performing the etch on the substrate being evaluated and processed. In at least one embodiment, the spike dosage can be calculated using an algorithm based on the amount of material removed from the particular substrate during the etching process, which can be calculated at the re-measuring step (step 460). More specifically, the algorithm is used to determine the spiking dosage needed for adding to the chemistry in order to restore the chemistry to at least substantially its previous concentration (i.e., the concentration of the chemistry present in the etching apparatus 210 prior to the etching of the particular substrate being processed).

In one or more preferred embodiments, the spike dosage is calculated using an algorithm based on a calculated substrate removal value corresponding to the amount of material to be removed from that particular substrate (calculated at step 425) as a result of etching the substrate from the calculated initial etch profile to the final etch profile. In other words, the calculated substrate removal value corresponds to the anticipated amount of substrate material that is removed to etch the substrate to the final etch profile. Again, the algorithm is used to determine the spiking dosage needed for adding to the chemistry in order to restore the chemistry to its previous concentration. As discussed above with respect to step 425, it should be understood that the calculated substrate removal value corresponding to the amount of material to be removed from the particular substrate is an unverified approximation of the amount of material to be removed upon etching. In this embodiment (in which spike dosage is calculated using the calculated substrate removal value), the overall etch process can be optimized since the spiking of the chemistry can be performed without waiting for the results of the step of remeasuring the substrate which is performed at a different station than the etch station 200. By spiking the chemistry at the etch station 200 immediately after the etched substrate is removed from station 200, the next substrate to be processed can be loaded into the wet etching apparatus 210.

In sum, because the calculated substrate removal value (unverified approximation) can be sued to calculate the spike dosage, rather than the actual measured amount of material removed (determined at step 460), the spike dosage can be added back to the chemistry (etchant) [step 280, below] prior to the re-measuring step 460. As such, because the chemistry has been restored back to its previous concentration levels, the next substrate can begin before the re-measuring of the prior substrate. Thus, in this embodiment, fewer steps are required before a new substrate can begin the process 400. In at least one implementation in which the calculate substrate removal value is used to determine the spike dosage, the re-measuring step 260 can be eliminated all together.

At step 480, processor 310 executing one or more software modules 330, including preferably adaptive spiking module 377, can configure the process controller 305 to cause the etching apparatus 210 to add the spike dosage (spiking charge) calculated in step 460 to the existing chemistry volume. In one or more embodiment, the spiking charge can comprise one or chemicals in the chemistry, such as HF and/or nitric acid. In one or more embodiments, volume or magnitude of the spiking charge (spiking volume) of HF is 2.00 ml±0.5%. The ability of the system to "spike" the chemistry with a different spike volume based on the amount of material removed from the particular substrate (i.e., unique etch profile) is referred to as "adaptive spiking".

As shown in FIG. 8 and described herein, the step 470 can occur prior to steps 440, 450 and 460; however, the step 480 is performed after step 440 is performed and once the wafer is removed from the etch station (and is then subsequently moved by device 270 to the next station (e.g., cleaning stations 230, 240).

Accordingly, system 100 executing process flow 400 provides a fully automated, production grade, solution that: uses specialized metrology to generate, in real time, etch recipes that are specifically tailored to each substrate being etched and based on previously etched substrates; and etches the substrates using a single wafer wet etch apparatus. As a result, the system can achieve a precise etch depth, surface uniformity and in general produce higher quality substrates, minimize waste and realize the benefits associated with a single wafer wet etch process. Further, the system can calculate the amount of material to be removed from each substrate during the etching process, which can then be used to determine the proper spike dosage needed to the restore the chemistry to at least substantially its previous concentration (i.e., at least substantially its concentration prior to etching of the particular substrate).

As mentioned above, the measurement steps and etching steps are all performed as part of an integrated system defined by complementary devices that are located within a single housing.

Figure 5A:
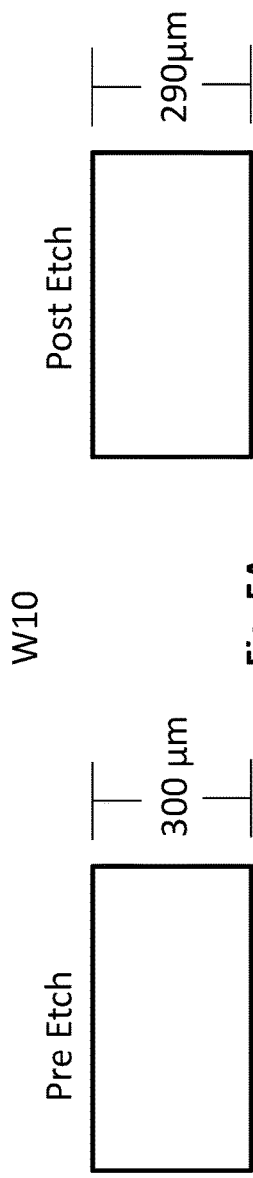
FIG. 5A shows a cross-sectional view of the first wafer (W1) both prior to and subsequent to the wafer undergoing a third etch process in accordance with the present embodiment which includes adaptive addition (spiking) of chemicals to provide a selected etch rate.
Figure 5B:
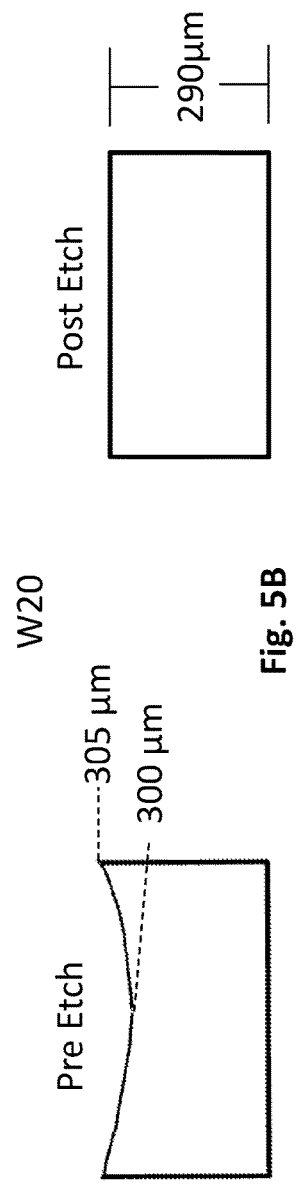
FIG. 5B shows a cross-sectional view of the second wafer (W2) both prior to and subsequent to the wafer undergoing a third etch process in accordance with the present embodiment which includes adaptive addition (spiking) of chemicals to provide a selected etch rate.
Figure 5C:
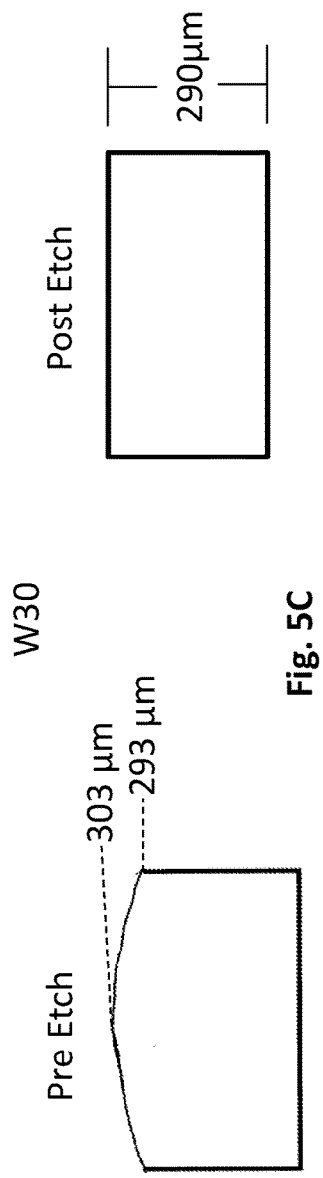
FIG. 5C shows a cross-sectional view of the third wafer (W3) both prior to and subsequent to the wafer undergoing a third etch process in accordance with the present embodiment which includes adaptive addition (spiking) of chemicals to provide a selected etch rate.

FIGS. 5A-5C illustrate exemplary implementations of the present embodiment. As in the examples of FIGS. 3A, 3B, 4A and 4B, the example in FIG. 5A is based on the first wafer 10 which prior to etching has a uniform profile; the example in FIG. 5B is based on the second wafer 20 which prior to etching has a non-uniform profile defined by a thicker edge; and the example in FIG. 5C is based on the third wafer 30 which prior to etching has a non-uniform profile defined by a thicker center.

For example, FIG. 5A depicts the first wafer 10 both pre and post etching. As shown, the first wafer 10 initially has a thickness of 300 microns and it is desired to remove a selected amount of material, in this case 10 microns, thereby producing a wafer having a thickness of 290 microns. The first wafer 10, as shown, has a uniform profile prior to etching which is calculated using the measuring device 120.

As described herein, prior to etching the first wafer, the batch chemistry is spiked with a first calculated amount of chemistry (i.e., a first spiking charge), in this case 2.0 ml, which is added to the chemistry. The etching process results in the desired 10 microns being removed from the first wafer 10. The post etch wafer thus has a planar top surface.

FIG. 5B depicts the second wafer 20 both pre and post etching. As shown, the second wafer 20 does not have a uniform top surface due to a center to edge variation (i.e., the edge is thicker). Since the second wafer does not have a uniform construction, the amount of material to be removed from the second wafer 20 to obtain the desired wafer etch to 290 microns is not 10 microns since the second wafer 20 is not a planar 300 micron thickness wafer (unlike the first wafer 10). In the example of FIG. 5B, the amount of material to be removed is calculated to be 11 microns. Based on this calculation of the amount of material to remove, the magnitude of the spiking charge (amount of chemistry to be added) is calculated. In this case, the magnitude of the spiking charge is calculated to be 2.2 ml.

FIG. 5C depicts the third wafer 30 both pre and post etching. As shown, the third wafer 30 does not have a uniform top surface due to a center to edge variation (i.e., the center is thicker). Since the third wafer 30 does not have a uniform construction, the amount of material to be removed from the third wafer 30 to obtain the desired wafer etch to 290 microns is not 10 microns since the third wafer 30 is not a planar 300 micron thickness wafer (unlike the first wafer 10). In the example of FIG. 5C, the amount of material to be removed is calculated to be 9 microns. Based on this calculation of the amount of material to remove, the magnitude of the spiking charge (amount of chemistry to be added) is calculated. In this case, the magnitude of the spiking charge is calculated to be 1.8 ml which restores the chemistry to the original desired concentration.

As discussed herein, there is a correlation between the amount of material to be removed and the magnitude of the spiking charge. More specifically, the adaptive spiking module 331 includes an algorithm that is a function of the volume of material to be removed as measured at step 425 which is a function of the wafer profile that is determined in accordance with step 430.

The spiking program of the present embodiment is thus intended to be implemented after an initial substrate is etched and chemistry has been used to etch the initial substrate (wafer W1) and is thus in need of refreshing in order to at least substantially restore the chemistry to the intended, target concentration. In particular and for a given etch program, the concentration of the etchant chemistry is selected and the spike dosage is calculated to restore the etchant chemistry to within an acceptable concentration range (a tolerance range) relative to the selected concentration.

As described herein, prior to etching the second wafer (W2), the batch chemistry is spiked with a first calculated amount of chemistry (i.e., a first spiking charge), in this case 2.0 ml, which is added to the chemistry. The etching process results in the desired 10 microns being removed from the first wafer 10.

When chemistry (i.e., 2.0 ml) is added to the batch of chemistry to maintain the etch rate, the resulting (observed) etch rate for the second wafer (W2) is maintained and results in 10 microns of material being removed. It will therefore be appreciated that the adaptive spiking program allows for the non-uniformities of the substrates (wafers) to be corrected. Unlike the example shown in FIG. 4B, the example shown in FIG. 5B illustrates that the etching of the second wafer has a corrective effect in that the final etch profile is a uniform etch profile. Similarly, the non-uniformity of the third wafer (W3) shown in FIG. 5C is also corrected during the etch process.

The adaptive spiking process of the present embodiment that eliminates the under etching and over etching events that occurred in conventional spiking programs as a result of the spiking dosage being a non-constant amount (volume) that is specifically calculated based on the unique etch profile of the wafer undergoing the etch process.

It should be understood that in between each process step discussed in relation to FIG. 8, processor 310 executing one or more of software modules 330 configures process controller 305 to cause wafer transfer device 270 to move the particular wafer between the various stations performing the process steps.

Preferably, throughout the execution of process flow 400, various information and data is collected by the components of system 100, including but not limited to process controller 305, measuring station 110, etch station 200, cleaning station(s) 230/240, and the computer controlled devices or controllers associated therewith including but not limited to wafer transfer device 270, measuring device 120, wet etch apparatus 210, etch tool 215, and etch controller 250. Processor 310, executing one or more software modules 330, including, database module 378 and display module 380, can configure process controller 305 to collect at least a portion of the data from the various components of system 100, store the collected data in storage 390 and/or memory 320. Furthermore, process controller 305 can display the data on display 340, either in raw form, or manipulated form such as a graphical representation as would be understood by those skilled in the art.

At this juncture, it should be noted that although much of the foregoing description has been directed to a system for performing a wet etching process and methods for wet etching substrates to reveal TSVs, the systems and methods disclosed herein can be similarly deployed and/or implemented in scenarios, situations, and settings far beyond the referenced scenarios. It can be readily appreciated that the system for performing a wet etching process can be effectively employed in practically any scenario in which a substrate is to be etched in a single wafer wet etching station to a desired surface uniformity and thickness.

It is to be understood that like numerals in the drawings represent like elements through the several figures, and that not all components and/or steps described and illustrated with reference to the figures are required for all embodiments or arrangements.

Thus, illustrative embodiments and arrangements of the present systems and methods provide a system, processes and computer implemented control methods, computer system, and computer program product for wet etching substrates. The flowchart and block diagrams in the figures illustrate the architecture, functionality, and operation of possible implementations of systems, methods and computer program products according to various embodiments and arrangements. In this regard, each block in the flowchart or block diagrams as it relates to a computer implemented method can represent a module, segment, or portion of code, which comprises one or more executable instructions for implementing the specified logical function(s).

It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the embodiment. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components, and/or groups thereof.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

The subject matter described above is provided by way of illustration only and should not be construed as limiting. Various modifications and changes can be made to the subject matter described herein without following the example embodiments and applications illustrated and described, and without departing from the true spirit and scope of the present embodiment, which is set forth in the following claims.

What is claimed:

1. A method for wet etching a plurality of substrates using a single wafer wet etching processing system resulting in each substrate having a desired final etch profile, comprising the steps of:
   a. measuring, at a measurement station, initial thickness information for one substrate of the plurality of substrates to be etched;
   b. calculating an etch profile for the one substrate according to the initial thickness information;
   c. generating an etch recipe for the one substrate according to the calculated etch profile and the desired final etch profile;
   d. calculating a substrate removal amount that corresponds to an amount of substrate material removed as a result of etching the one substrate from the calculated etch profile to the desired final etch profile;
   e. etching the one substrate with a first concentration of etchant and according to the etch recipe in order to achieve the desired final etch profile, wherein completion of the etching step depletes the etchant to a second concentration that is less than the first concentration;
   f. calculating a spike dosage of etchant to add back to the etchant after the one substrate has been etched with the etchant but prior to performing a subsequent etch on a subsequent substrate to restore an amount of the etchant from the second concentration to the first concentration, the spike dosage being calculated based on the calculated substrate removal amount;
   g. adding the spike dosage to the etchant after the one substrate has been etched and prior to etching the subsequent substrate; and
   h. repeating steps a to g for each subsequent substrate to be etched.

2. The method of claim 1 wherein measuring the initial thickness information includes optically scanning one or more locations on a surface of the one substrate and recording a value of a detected thickness for the one or more locations as the initial thickness information.

3. The method of claim 1, wherein the initial thickness information includes a value of the thickness of the one substrate at one or more radial locations on the surface of the one substrate and wherein the desired final etch profile specifies a prescribed thickness value of the one substrate at each of the plurality of radial locations.

4. The method of claim 1, wherein the step of calculating the etch profile for the one substrate further comprises calculating radial thickness for the one substrate and calculating etch depth according to an algorithm that is as a function of the radial thickness and the desired final etch profile.

5. The method of claim 4, wherein the etch depth is also calculated as a function of a reference height of one or more vias within the one substrate.

6. The method of claim 1, wherein the etch profile for the one substrate is calculated according to an algorithm that is a function of a final thickness information of the one substrate that was etched immediately prior.

7. The method of claim 1, wherein the step of etching the one substrate includes dispensing a chemical etchant onto the surface of the one substrate according to the etch recipe by a single wafer wet etching device that is located at the etch station.

8. The method of claim 1, further comprising the step of measuring final thickness information at the measurement station for the one substrate after etching the one substrate and in the event that the desired final etch profile has not been achieved based on the measured final thickness information, then the one substrate is delivered back to the etch station by an automated substrate transfer device.

9. The method of claim 1, wherein initial thickness information is measured at a plurality of radial locations on a surface of the one substrate.

10. The method of claim 1, wherein the desired final etch profile defines a prescribed thickness of the one substrate at one or more radial locations on a surface of the one substrate.

11. The method of claim 10, wherein the step of calculating the etch profile includes for each of a plurality of radial locations, calculating a respective etch depth according to the measured initial thickness information for the respective radial location and according to the prescribed thickness for the radial location after etching, wherein each radial location completely and continuously surrounds a center of the surface at a respective radial distance from the center whereby each radial location is ring-shaped and the radial locations are concentric to one another.

12. The method of claim 11, wherein the initial thickness information includes a value of thickness of the one substrate measured at each of the plurality of radial locations on the surface of the one substrate, and wherein the desired final etch profile specifies a prescribed thickness value of the one substrate at each of the plurality of radial locations.

13. The method of claim 12, wherein the step of calculating the respective etch depth further comprises subtracting the prescribed value of thickness for the one substrate at the respective radial location from the value of thickness measured at the respective radial location.

14. The method of claim 1, wherein the step of calculating the substrate removal amount comprises calculating a volume of substrate material removed using an algorithm.

15. The method of claim 1, wherein the step of calculating the substrate removal amount comprises the steps of: determining an amount of substrate material removed at plurality of radial locations of the one substrate and averaging the amounts removed at the plurality of the radial locations to derive at the calculated substrate removal amount.

16. The method of claim 1, wherein the step of calculating the substrate removal amount comprises the steps of subtracting a value of a total volume of the one substrate having the calculated etch profile prior to etching from a value of the total volume of the one substrate having the desired final etch profile after etching.

17. The method of claim 1, wherein the step of calculating the spike dosage comprises the step of using an algorithm.

18. The method of claim 1, wherein the spike dosage is added back to the etchant using a metering pump.

19. The method of claim 1, wherein the calculated etch profile comprises a non-uniform etch profile and the desired final etch profile comprises a uniform etch profile.

20. The method of claim 1, wherein the spike dosage is an amount of the etchant that once added to the etchant allows a selected etch rate to be at least substantially maintained for successive etch runs.

21. The method of claim 1, wherein the etchant has an initial etch concentration value prior to etching and wherein the spike dosage is an amount of the etchant that restores the concentration of used etchant to at least substantially the initial etch concentration value.

22. A method to control etch rate through adaptive spiking of etchant chemistry comprising the steps of:
  measuring, at a measurement station, initial thickness information for a particular substrate;
  calculating an initial etch profile for the particular substrate according to the initial thickness information;
  selecting a desired final etch profile for the particular substrate to be achieved upon etching the particular substrate;
  etching the particular substrate with an etchant and according to an etch recipe in order to achieve the desired final etch profile;
  calculating a substrate removal amount that corresponds to an amount of substrate material removed upon etching the particular substrate from the calculated etch profile, starting from an initial etchant concentration, to the desired final etch profile; and
  calculating a spike dosage of etchant to add back to the etchant after etching the particular substrate depletes a portion of the etchant and prior to performing a subsequent etch on a subsequent substrate, the spike dosage being calculated based on the calculated substrate removal amount and being an amount of the etchant that restores the etchant to the initial etchant concentration.

23. A method for wet etching a plurality of substrates using a single wafer wet etching processing system resulting in each substrate having a desired final etch profile, comprising the steps of:
  measuring, at a measurement station, initial thickness information for a first substrate of the plurality of substrates to be etched;
  calculating a first etch profile for the first substrate according to the initial thickness information;
  generating a first etch recipe for the first substrate according to the calculated first etch profile and the final etch profile;
  calculating a first substrate removal amount that corresponds to an amount of substrate material removed as a result of etching the first substrate from the calculated first etch profile to the desired final etch profile for the first substrate;
  etching the first substrate with an etchant, starting with a first concentration of etchant, and according to the first etch recipe in order to achieve the desired final etch profile, wherein completion of the step of etching the first substrate results in depletion of the etchant to a second concentration that is less than the first concentration;
  calculating a first spike dosage of etchant to add back to spent etchant that remains after the first substrate has been etched but prior to performing a subsequent etch on a second substrate, the first spike dosage being calculated based on the calculated first substrate removal amount for the first substrate so as to restore the etchant to the first concentration;
  adding the first spike dosage to the etchant after the first substrate has been etched and prior to etching the second substrate;
  measuring, at a measurement station, initial thickness information for a second substrate of the plurality of substrates;
  calculating a second etch profile for the second substrate according to the initial thickness information for the second substrate;
  generating a second etch recipe for the second substrate according to the calculated second etch profile and the final etch profile for the second substrate;
  calculating a second substrate removal amount that corresponds to an amount of substrate material removed as a result of etching the second substrate from the calculated second etch profile to the desired final etch profile for the second substrate;
  etching the second substrate, starting with the first concentration of etchant, with an etchant and according to the second etch recipe in order to achieve the desired final etch profile of the second substrate, wherein completion of the step of etching the second substrate results in depletion of the etchant to a third concentration that is less than the first concentration;
  calculating a second spike dosage of etchant to add back to spent etchant that remains after the second substrate has been etched with the etchant but prior to performing a subsequent etch on a third substrate, the second spike dosage being calculated based on the calculated second substrate removal amount for the second substrate so as to restore the etchant to the first concentration; and
  adding the second spike dosage to the etchant after the second substrate has been etched and prior to etching the third substrate;
  wherein the first spike dosage has a volume that is different than a volume of the second spike dosage as a result of the calculated first substrate removal amount being different than the calculated second substrate removal amount.

* * * * *